United States Patent
Ju et al.

(10) Patent No.: US 10,706,755 B2
(45) Date of Patent: Jul. 7, 2020

(54) ORGANIC LIGHT EMITTING DIODE DISPLAY AND REPAIRING METHOD THEREOF

(71) Applicant: Samsung Display Co., Ltd., Yongin-si (KR)

(72) Inventors: Sung Bae Ju, Hwaseong-si (KR); Sang Jin Park, Yongin-si (KR); Dong Hyun Yang, Seongnam-si (KR); In Kyung Yoo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/372,248

(22) Filed: Apr. 1, 2019

(65) Prior Publication Data

US 2020/0051472 A1    Feb. 13, 2020

(30) Foreign Application Priority Data

Aug. 7, 2018   (KR) .................. 10-2018-0092065

(51) Int. Cl.
*G09G 3/00*     (2006.01)
*G09G 3/3258*   (2016.01)
*H01L 51/00*    (2006.01)
*H01L 51/56*    (2006.01)

(52) U.S. Cl.
CPC .......... *G09G 3/006* (2013.01); *G09G 3/3258* (2013.01); *H01L 51/0031* (2013.01); *H01L 51/56* (2013.01); *G09G 2300/0439* (2013.01); *G09G 2330/12* (2013.01); *H01L 2251/568* (2013.01)

(58) Field of Classification Search
None
See application file for complete search history.

(56) References Cited

U.S. PATENT DOCUMENTS

| | | | |
|---|---|---|---|
| 8,451,196 B2 | 5/2013 | Park et al. | |
| 10,510,277 B2* | 12/2019 | Wang | G09G 3/006 |
| 2012/0206145 A1* | 8/2012 | Kim | G09G 3/006 |
| | | | 324/414 |
| 2014/0118236 A1* | 5/2014 | Jin | G09G 3/20 |
| | | | 345/93 |
| 2014/0154818 A1 | 6/2014 | Shimamura et al. | |
| 2017/0053591 A1* | 2/2017 | Seo | G09G 3/3225 |

FOREIGN PATENT DOCUMENTS

| | | |
|---|---|---|
| JP | 2003-051384 | 2/2003 |
| JP | 4067875 | 3/2008 |
| JP | 6142212 | 6/2017 |
| KR | 10-2008-0061823 | 7/2008 |
| KR | 10-0853540 | 8/2008 |
| KR | 10-2017-0064163 | 6/2017 |

* cited by examiner

*Primary Examiner* — J. E. Schoenholtz
(74) *Attorney, Agent, or Firm* — H.C. Park & Associates, PLC

(57) ABSTRACT

A repairing method of an organic light emitting diode display, including: a repairability checking step for applying a first positive bias to a pixel including a driving transistor and an organic light emitting diode based on the organic light emitting diode; and a stress applying step for applying a second positive bias that is greater than the first positive bias to the organic light emitting diode.

20 Claims, 13 Drawing Sheets

FIG. 12

|  | Normal Driving | Repairability checking step |
|---|---|---|
| Initialization voltage (Vint) | -5V | -15V |
| Second driving voltage (ELVSS) | -2V | -2V |
| Driving voltage (ELVDD) | +6.5V | +6.5V |
| Second transistor (T2) | Performing of Initialization /programming or the like | Off |
| Third transistor (T3) | Performing of Initialization /programming or the like | Off |

FIG. 13

| | Normal Driving | Stress application step |
|---|---|---|
| Initialization voltage (Vint) | -5V | -15V |
| Second driving voltage (ELVSS) | -2V | -15V |
| Driving voltage (ELVDD) | +6.5V | +12V |
| Second transistor (T2) | Performing of Initialization /programming or the like | Off |
| Third transistor (T3) | Performing of Initialization /programming or the like | Off |

ORGANIC LIGHT EMITTING DIODE DISPLAY AND REPAIRING METHOD THEREOF

CROSS-REFERENCE TO RELATED APPLICATION

This application claims priority from and the benefit of Korean Patent Application No. 10-2018-0092065 filed on Aug. 7, 2018, which is hereby incorporated by reference for all purposes as if fully set forth herein.

BACKGROUND

Field

Exemplary embodiments of the invention relate generally to an organic light emitting diode display and a repairing method thereof.

Discussion of the Background

A display device serves to display an image. Recently, organic light emitting diode (OLED) displays have attracted attention.

An OLED display has a self-emission characteristic, eliminating the necessity for a light source, unlike a liquid crystal display (LCD) device, and thus can be fabricated to be thinner and lighter. Further, the OLED display has high quality characteristics such as low power consumption, high luminance, high response speed, and the like.

In general, the organic light emitting diode display uses a new technology compared to a liquid crystal display, and therefore has a drawback of a high defect rate as a whole. In the case of such defects, the display panel is treated as defective and discarded.

In addition, the organic light emitting diode (OLED) display has a complicated pixel structure as compared with the liquid crystal display, and it is difficult to provide a space for forming pixels as the resolution increases.

The above information disclosed in this Background section is only for understanding of the background of the inventive concepts, and, therefore, it may contain information that does not constitute prior art.

SUMMARY

Exemplary embodiments of the inventive concepts have been made in an effort to configure a pixel including three transistors so as to reduce an area occupied by the pixel, and to repair a pixel which does not normally turn on so as to turn on normally.

Additional features of the inventive concepts will be set forth in the description which follows, and in part will be apparent from the description, or may be learned by practice of the inventive concepts.

An exemplary embodiment provides a repairing method of an organic light emitting diode display, including: a repairability checking step for applying a first positive bias to a pixel including a driving transistor and an organic light emitting diode based on the organic light emitting diode; and a stress applying step for applying a second positive bias that is greater than the first positive bias to the organic light emitting diode.

The first positive bias and the second positive bias may be determined by a driving voltage and a second driving voltage applied to the pixel.

The driving voltage and the second driving voltage applied for the first positive bias may be equal to a driving voltage value and a second driving voltage value applied to the pixel during a normal driving period for displaying an image.

The driving voltage applied for the second positive bias may be greater than the driving voltage applied for the first positive bias, and the second driving voltage applied for the second positive bias may be less than the second driving voltage applied for the first positive bias.

The driving voltage applied for the second positive bias has a value of 1.5 to 2 times that of the driving voltage applied for the first positive bias, and the second driving voltage applied for the second positive bias may be 7.5 to 10 times that of the second driving voltage applied for the first positive bias.

The repairability check step may check whether repair is possible when the organic light emitting diode normally emits light.

The stress applying step is performed for from about 300 seconds to 10 minutes.

The pixel may further include a storage capacitor connected to a gate electrode of the driving transistor, an initialization voltage may be applied to a second end of the storage capacitor, and a same initialization voltage may be applied in the repairability checking step and the stress applying step.

The initialization voltage may enable the driving transistor to turn on.

When a point where the driving transistor and the organic light emitting diode are connected is defined to as a node A, the pixel further includes a second transistor and a third transistor connected between the gate electrode of the driving transistor and the node A, and the second transistor and the third transistor may be maintained in an off-state in the repairability checking step and the stress applying step.

An exemplary embodiment provides an organic light emitting diode display including: an organic light emitting diode; a driving transistor configured to supply a current to the organic light emitting diode; a storage capacitor connected to the gate electrode of the driving transistor; when a node where the organic light emitting diode and the driving transistor are connected is defined to as a node A, a second transistor and a third transistor connected between the node A and the gate electrode of the driving transistor; and when a node between the second transistor and the third transistor is defined to as a node N, an input capacitor connected between the node N and a data line, wherein an initialization voltage is applied to a second end of the storage capacitor, a driving voltage is applied to the driving transistor, and a second driving voltage is applied to a second end of the organic light emitting diode.

The second transistor may be operated by a scan signal, and the third transistor may be operated by a control signal.

The pixel may sequentially emit light through an initialization period, a threshold voltage compensation period, a programming period, and a light emission period.

In the light emission period, a high voltage may be applied as the driving voltage, a low voltage may be applied as the second driving voltage, a high voltage may be applied as the initialization voltage, and low voltages may be applied as the scan signal and the control signal.

A high voltage may be applied as the second driving voltage except in the light emission period.

In the initialization period, a low voltage may be applied as the driving voltage, low voltages may be applied as the scan signal and the control signal, and a low voltage may be applied as the initialization voltage.

In the threshold voltage compensation period, a high voltage may be applied as the driving voltage, a high voltage may be applied as the initialization voltage, and the scan signal and the control signal may be changed from a low voltage to a high voltage.

In the programming period, a low voltage may be applied as the driving voltage, a high voltage may be applied as the initialization voltage, a high voltage is applied as the control signal, and a low voltage is sequentially applied as the scan signal.

The pixel may further include an on-bias period. In the on-bias period, the initialization voltage may be changed to a low voltage and then to a high voltage.

A data voltage applied to the data line may change a voltage of the node N, and a voltage of the node N may be stored in the storage capacitor when the second transistor is turned on.

According to the exemplary embodiments, the number of transistors included in a pixel can be decreased to reduce the size of a pixel by including three transistors in one pixel, so as to manufacture an organic light emitting diode display suitable for high resolution. In addition, in the case where there is a pixel which does not normally light in the organic light emitting diode display, the defect rate can be reduced by repairing the pixel so that the pixel can be normally turned on without processing the display device as defective.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 12 and FIG. 13 illustrate voltages applied in a repairing method of an organic light emitting diode display according to an exemplary embodiment.

DETAILED DESCRIPTION

Figure 1:
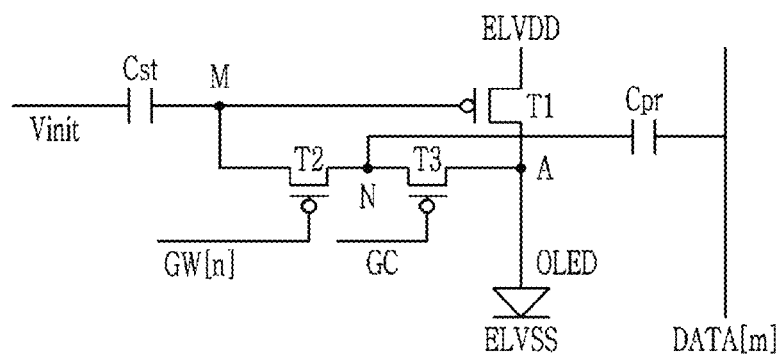
FIG. 1 illustrates an equivalent circuit diagram of one pixel of an organic light emitting diode display according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

Further, in the specification, the phrase "in a plan view" means when an object portion is viewed from above, and the phrase "in a cross-sectional view" means when a cross-section taken by vertically cutting an object portion is viewed from the side.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, one pixel of an organic light emitting diode display according to an exemplary embodiment will be described with reference to FIG. 1 and FIG. 2.

FIG. 1 illustrates an equivalent circuit diagram of one pixel of an organic light emitting diode display according to an exemplary embodiment.

The pixel of the organic light emitting diode display according to the present exemplary embodiment includes three transistors T1, T2, and T3, two capacitors Cst and Cpr, and an organic light emitting diode OLED.

The driving transistor T1 serves to change a voltage applied to a gate electrode according to a data voltage, and transfer a thus-generated output current to the organic light emitting diode OLED. A gate electrode of the driving transistor T1 is connected to the storage capacitor Cst, a driving voltage ELVDD (hereinafter also referred to as a first driving voltage) is applied to a first electrode thereof, and an electrode of the organic light emitting diode OLED is connected to a second electrode. Hereinafter, a point where the second electrode of the driving transistor T1 and one electrode of the organic light emitting diode OLED are connected is defined to as a node A. In addition, a point where the gate electrode of the driving transistor T1 and the storage capacitor Cst are connected is defined to as a node M. A first electrode of the organic light emitting diode OLED is connected to the node A and a second voltage ELVSS is applied to a second electrode thereof. In this case, the first electrode of an organic light emitting diode OLED may serve as an anode.

In addition, the second transistor T2 and the third transistor T3 are connected between the node M (the gate electrode of the driving transistor T1) and the node A (the second electrode of the driving transistor T1). Hereinafter, a point where the second transistor T2 and the third transistor T3 are connected is defined to as a node N.

First, the second transistor T2 will be described.

The second transistor T2 is disposed between the node M and the node N. A first electrode of the second transistor T2 is connected to the node N, and thus is connected to the third transistor T3. A second electrode thereof is connected to the node M, and thus is connected to the gate electrode of the driving transistor T1. The gate electrode of the second transistor T2 is connected to a gate line GW [n], and thus is turned on sequentially depending on a scan signal.

The third transistor T3 is disposed between the node A and the node N. A first electrode of the third transistor T3 is connected to the node A, and thus is connected to the second electrode of the driving transistor T1 and a first electrode of the organic light emitting diode OLED. A second electrode of the third transistor T3 is connected to the node N, and thus is connected to the first electrode of the second transistor T2, while a gate electrode of the third transistor T3 is connected to the control signal line GC.

The second transistor T2 enables a voltage of the node N depending on the data voltage to be transferred to the gate electrode (node M) of the driving transistor T1. The second transistor T2 and the third transistor T3 operate together to initialize the voltage of the node A.

The storage capacitor Cst serves to store and maintain the voltage transferred to the gate electrode (node M) of the driving transistor T1 through the second transistor T2. A first end electrode of the storage capacitor Cst is connected to the node M, and thus is connected to the gate electrode of the driving transistor T1, while a second end electrode thereof is connected to an initialization voltage Vinit.

Further, a data line DATA[m] and a corresponding pixel are connected by the input capacitor Cpr. The input capacitor Cpr is formed between the data line DATA [m] and the node N, a first electrode of the input capacitor Cpr is connected to the node N, and a second electrode thereof is connected to the data line DATA [m]. As a result, as a voltage of the data line changes, the voltage of the node N changes accordingly. Specifically, when a voltage of the second electrode of the input capacitor Cpr connected to the data line DATA [m] changes depending on the data voltage, a voltage of the node N connected with the first electrode thereof also changes accordingly, and only the voltage selected by a scan signal among them is transferred to the gate electrode (node M) of the driving transistor T1.

Hereinafter, an operation according to a signal applied to the pixel shown in FIG. 1 will be described with reference to FIG. 2.

Figure 2:
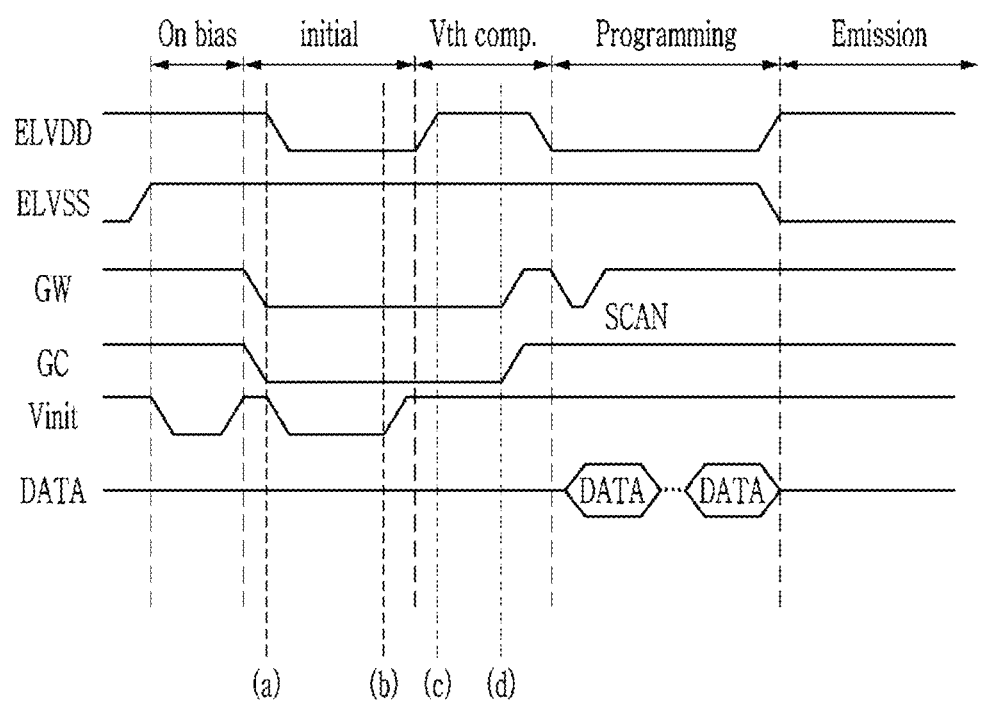
FIG. 2 illustrates a timing diagram of signals applied to one pixel of an organic light emitting diode display according to an exemplary embodiment.

FIG. 2 illustrates a timing diagram of signals applied to one pixel of an organic light emitting diode display according to an exemplary embodiment.

The pixel of the organic light emitting diode display according to the present exemplary embodiment operates differently depending on an on-bias period On bias, an initialization period Initial, a threshold voltage compensation period Vth comp., a programming period Programming, and a light emission period Emission.

The organic light emitting element OLED which emits light during the light emission period Emission stops emitting light as a current flowing from a side of the driving voltage ELVDD, i.e., the first electrode, to a side of the second driving voltage ELVSS, i.e., the second electrode, based on the organic light emitting element OLED that stops flowing while a voltage of the second driving voltage ELVSS applied to the second electrode of the organic light emitting element OLED is changed to a high voltage.

Thereafter, it enters the on-bias period On bias. In the on-bias period On bias, the initialization voltage changes to a low voltage and then to a high voltage. As a voltage of the second electrode of the storage capacitor Cst to which the initialization voltage (Vinit) is applied is changed to a low voltage and then a high voltage, a voltage of the first electrode of the storage capacitor Cst, i.e., the node M, also increases and then decreases. In this case, the voltage of the gate electrode of the driving transistor T1 and the voltage of the second electrode of the second transistor T2 are instantaneously changed. However, the pixel is not generally changed. Specifically, since the second transistor T2 is turned off, the node N is not affected. The driving transistor T1 is turned on, but the second driving voltage ELVSS of the organic light emitting diode OLED has a high voltage, so that a current may not flow to the organic light emitting diode OLED and the driving voltage ELVDD may be maintained by the voltage of the node A. The third transistor T3 is also turned off, so that the voltage of the node A does not affect the node N.

After the initialization voltage changes back to a high voltage, it enters the initialization period Initial. The initialization period Initial starts by changing a scan signal applied to a gate line GW [n] and a control signal applied to a control signal line GC to low voltages. Accordingly, the second transistor T2 and the third transistor T3 are turned on, and the node A is connected to the node via the node N.

The on-bias period On bias, which is a short period before the initialization period Initial, may not be provided according to another exemplary embodiment. In this case, it is possible to immediately enter the initialization period initial.

Then, the driving voltage ELVDD and the initialization voltage Vinit are changed to low voltages at a time point "a" in the initialization period Initial. First, when the initialization voltage Vinit is changed to a low voltage, the voltage of the node M which is the first electrode of the storage capacitor Cst is also lowered. As a result, the degree of turning on the driving transistor T1 becomes sufficiently large. In the meantime, when the driving voltage ELVDD is changed to a low voltage, the voltage of the node A is changed to a low voltage through the driving transistor T1 which is turned on. Since the second transistor T2 and the third transistor T3 are turned on, the voltages of the node A, the node N, and the node M are the same, and the same voltage has a low voltage value of the driving voltage ELVDD. As a result, in this initialization period Initial, the voltages of the node A, the node N, and the node M are initialized to the low voltage value of the driving voltage ELVDD. In particular, in the initialization period Initial, when charges are accumulated in a pixel, a route is formed to discharge the charges to the driving voltage ELVDD.

In the initialization period Initial, the initialization voltage Vinit starts to be changed to a high voltage again at a time point "b", and it ends when the initialization voltage Vinit is changed to the high voltage. In this case, the voltage of the node M may be a voltage such that the driving transistor T1 is partially turned on.

Thereafter, the threshold voltage compensation period Vth comp. starts by changing the driving voltage ELVDD back to the high voltage. Next, when the driving voltage ELVDD is changed to a high voltage at a time point "c," since the driving transistor T1 is partially turned on depending on the voltage of the node M, the voltage of the node A has a value of Vgs+Vth. Herein, Vth is a threshold voltage Vth of the driving transistor T1, and Vgs is a voltage difference between the gate electrode and the first electrode of the driving transistor T1. Since the driving voltage ELVDD applied to the first electrode of the driving transistor T1 has a voltage value set as a high voltage, the voltage of the node A is changed depending on the voltage of the node M and the threshold voltage Vth of the driving transistor T1. In this case, since the second transistor T2 and the third transistor T3 are turned on, the voltages of the node A, the node N, and the node M are the same, so that the voltage of Vgs+Vth is applied as the voltage of the node M, and is stored in the storage capacitor Cst. In general, the current outputted from the driving transistor T1 may have a value that is proportional to a square value of Vgs'−Vth. Herein Vgs' indicates a voltage difference between the voltage of the gate electrode (the voltage of the terminal M) and the voltage of the first electrode (that is, the driving voltage ELVDD) when the driving transistor T1 outputs a current. However, since the voltage of the node M stored in the storage capacitor Cst includes the threshold voltage (Vth) as Vgs+Vth, the current outputted from the driving transistor T1 may be outputted regardless of the threshold voltage Vth. Therefore, even when the driving transistor T1 formed in each pixel has different characteristics and the threshold voltage Vth is different, an output current that is irrelevant thereto may be provided to an organic light emitting diode (OLED), thereby generating no difference in luminance for each pixel.

In the meantime, since the second driving voltage ELVSS of the organic light emitting diode OLED has a high voltage, no current flows through the organic light emitting diode OLED.

Thereafter, a scan signal applied to a gate line GW[n] and a control signal applied to a control signal line GC are changed to high voltages at a time point "d."

As a result, the node A, the node M, and the node N are electrically separated from each other, and the value stored in the storage capacitor Cst is maintained.

Thereafter, when the driving voltage ELVDD is changed to the low voltage while the driving voltage ELVDD is changed to the low voltage, the programming period Programming starts.

In the programming period Programming, the voltage of the node N when the second transistor T2 is turned on by the scan signal applied to the gate line GW [n] is applied to the node M to be further stored in the storage capacitor Cst.

In the programming period Programming, all the pixels included in the organic light emitting diode display are sequentially processed, and the pixels connected to the same gate line operate at a same time.

After the voltage of the node N is transferred to the node M for all the pixels, the driving voltage ELVDD and the second driving voltage ELVSS start to be changed to the high voltage and the low voltage, respectively, and when they do so, the programming period Programming ends and the light emission period Emission starts.

In the light emission period Emission, a current outputted from the driving transistor T1 is applied to the organic light emitting diode OLED through the node A, and the degree of emission of the organic light emitting diode OLED changes depending on the magnitude of the current. As described above, the current outputted from the driving transistor T1 may have a value that is proportional to a square of Vgs'−Vth, and since the value Vgs' already has the threshold voltage Vth, the outputted current has a characteristic that it is independent of the threshold voltage Vth. Accordingly, even when the driving transistor T1 disposed in each pixel has different threshold voltages Vth due to process dispersion, an output current of the driving transistor T1 may be made constant, thereby ameliorating non-uniformity of the characteristic.

In the light emission period Emission, all the pixels simultaneously emit light for a same period of time. For reference, all the pixels may perform a same operation except in the programming period Programming.

A pixel according to a typical example driving as such may not operate normally even if it does not have a defect in manufacturing. Herein, the defect in manufacturing indicates a case where the circuit of FIG. 1 may not be constructed due to short-circuit between wires or electrodes due to manufacturing problems.

For this, normal operation and abnormal operation will be described with reference to FIG. 3 to FIG. 5.

Figure 3:
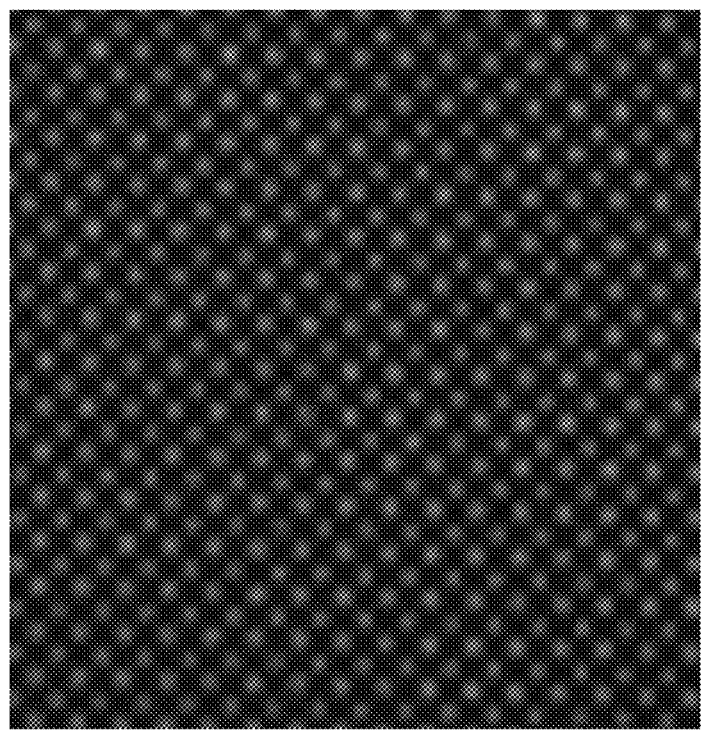
FIG. 3, FIG. 4, and FIG. 5 are photographs showing normally operated pixels and abnormally operated pixels among a plurality of pixels of an organic light emitting diode display.
Figure 4:
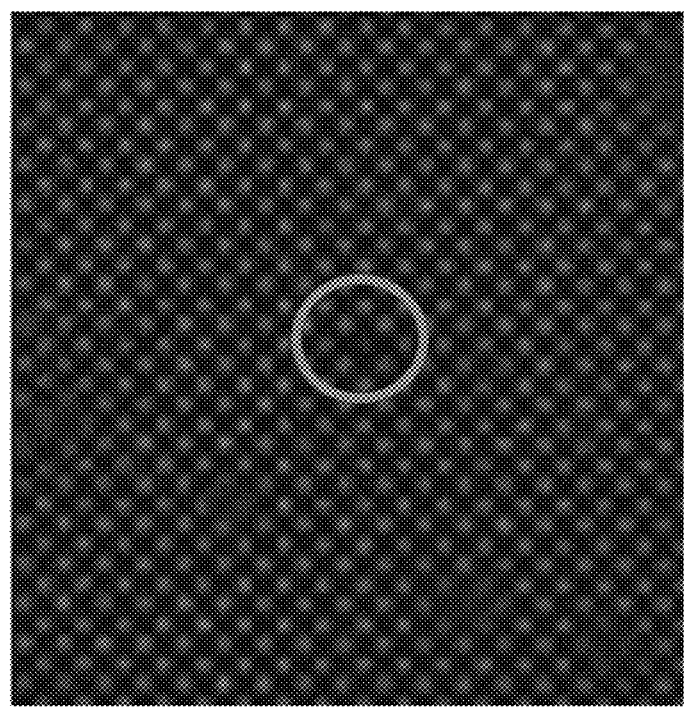
Figure 5:
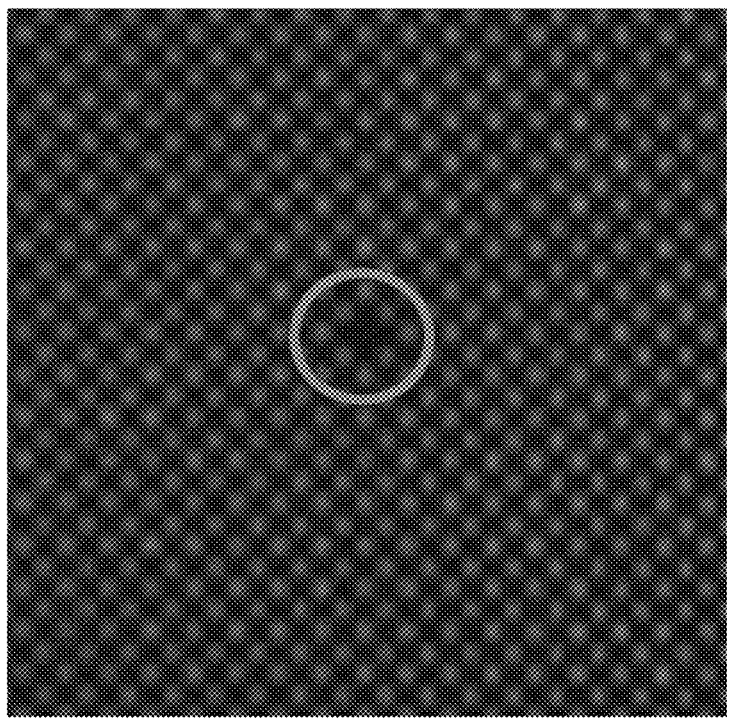

FIG. 3 to FIG. 5 are photographs showing normally operated pixels and abnormally operated pixels among a plurality of pixels of an organic light emitting diode display.

First, referring to FIG. 3, all the pixels are normally driven in the organic light emitting display device. As illustrated in FIG. 3, it is seen that all the pixels exhibit luminance above a certain level.

In contrast, FIG. 4 and FIG. 5 show that one pixel does not operate normally, wherein FIG. 4 shows a case where luminance is not equal to a desired luminance, and FIG. 5 shows a case in which luminance is not represented at all.

From pixels marked by circles in FIG. 4 and FIG. 5, it is seen that the luminance of the pixel is lower than that of pixels adjacent thereto according to FIG. 4, and light is not emitted in the pixel according to FIG. 5.

Such a problem may occur due to a defect in manufacturing, but may not be repaired by the repairing method described below due to the defect in manufacturing.

However, according to the present exemplary embodiment, some of the pixels of a 3T2C structure are not normally driven as in FIG. 4 and FIG. 5 even when there is no defect in manufacturing, and a method of repairing the pixels will be described as follows.

The repairing method of the organic light emitting diode display according to the present exemplary embodiment includes a repairability checking step for checking whether a repair can be performed, and a stress applying step for applying stress to a pixel.

A positive bias is applied to all of the organic light emitting diodes included in the pixel in the repairability checking step and the stress applying step. That is, a low voltage is applied as the second driving voltage ELVSS applied to the organic light emitting diode, and a high voltage is applied as the driving voltage ELVDD. When the positive bias applied to the organic light emitting diode in the repairability checking step is referred to as a first positive bias and the positive bias applied to the organic light emitting diode in the stress applying step is referred to as a second positive bias, the second positive bias is greater than the first positive bias. As a result, since it is only necessary to check whether repair is possible in the repairability checking step, it is not necessary to apply a positive bias to the organic light emitting diode to such an extent that stress is applied to the organic light emitting diode. However, according to the present exemplary embodiment, a bias applied to the organic light emitting element is increased to apply stress so as to repair a pixel that does not emit light normally.

Herein, whether the repair is possible is determined by checking whether the organic light emitting diode normally emits light when the first positive bias is applied thereto.

In addition, in the stress applying step, the second positive bias is applied for a predetermined time, and then is cut off so that the organic light emitting diode is no longer subjected to stress.

Since the positive bias applied to the organic light emitting diode is related to the output current of the driving transistor T1, it is necessary to lower the voltage of the node M in order to apply the positive bias, and for this purpose, the initialization voltage may be applied as a lower voltage.

A repairing method according to an exemplary embodiment will now described with reference to FIG. 6 to FIG. 12.

First, a step of checking whether a problem is caused by a defect in manufacturing or can be repaired by using the repairing method according to the present exemplary embodiment will be described with reference to FIG. 6 to FIG. 8. Hereinafter, this is also referred to as "repairability checking step."

A signal applied to a pixel in the repairability checking step and a corresponding operation of the pixel will be described with reference to FIG. 6 and FIG. 7.

Figure 6:
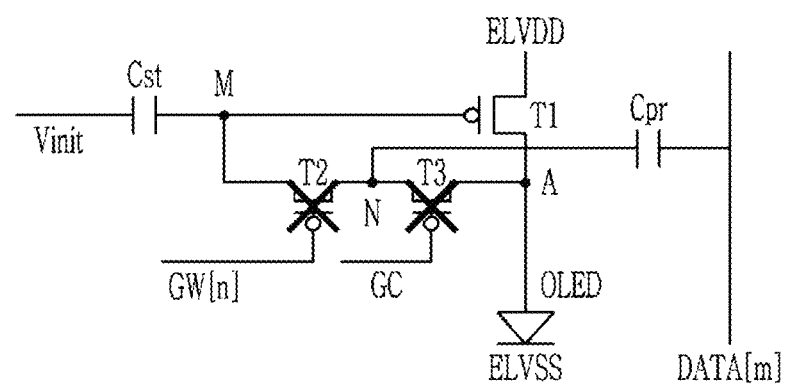
FIG. 6 illustrates an equivalent circuit diagram of one pixel in one step of a repairing method of an organic light emitting diode display according to an exemplary embodiment.
Figure 7:
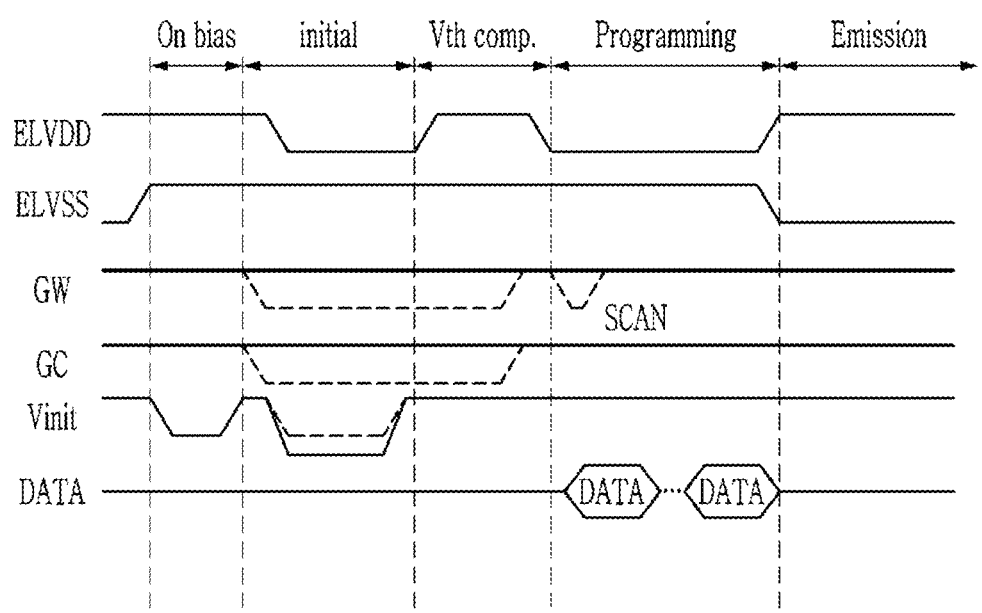
FIG. 7 illustrates a timing diagram of signals applied in one step of a repairing method of an organic light emitting diode display according to an exemplary embodiment.

FIG. 6 illustrates an equivalent circuit diagram of one pixel in one step of a repairing method of an organic light emitting diode display according to an exemplary embodiment, and FIG. 7 illustrates a timing diagram of signals applied in one step of a repairing method of an organic light emitting diode display according to an exemplary embodiment.

First, referring to FIG. 7, high voltages are applied as a scan signal applied to the gate line GW [n] and as a control signal applied to the control signal line GC for all the periods in order to check whether repair is possible. A dotted line in FIG. 7 illustrates a voltage in the case of the normal operation of FIG. 2.

When such application is performed, as illustrated in FIG. 6, the second transistor T2 and the third transistor T3 are not operated, so that the node M, the node N, and the mode A are not connected to each other.

Accordingly, in this case, the pixel is the same as a pixel including the driving transistor T1, the organic light emitting element OLED, and the holding capacitor Cst. This structure will be described in more detail below.

A gate electrode of the driving transistor T1 is connected to the storage capacitor Cst, a driving voltage ELVDD is applied to a first electrode thereof, and an electrode (node A)

of the organic light emitting diode OLED is connected to a second electrode. A first electrode of the organic light emitting diode OLED is connected to the node A and a second voltage ELVSS is applied to a second electrode thereof.

In the meantime, since the second transistor T2 and the third transistor T3 are maintained to be turned off, the node M, the node N, and the node A are electrically disconnected from each other. In addition, the voltage of the node N is changed depending on the data voltage, and the data voltage is applied to the node M through the node N, but since the second transistor T2 is maintained to be turned off, the voltage of the node M is not changed depending on the data voltage. As a result, the organic light emitting diode OLED according to FIG. 6 emits light regardless of the data voltage.

According to FIG. 7, the kind of signal that is applied to the pixel may be checked, unlike in the case of the normal driving.

In the repairability checking step, the driving voltage ELVDD and the second driving voltage ELVSS are applied in the same manner as in the normal driving, but the initialization voltage Vinit, the scan signal applied to the gate line GW[n], and the control signal applied to the control signal line GC are applied differently. First, only the high voltages are applied as the scan signal applied to the gate line GW[n] and the control signal applied to the control signal line GC, unlike the normal driving. As a result, the second transistor T2 and the third transistor T3 maintain a turn-off state. In addition, the initialization voltage Vinit is changed from a low voltage to a high voltage in the initialization period Initial. In the present exemplary embodiment, when a value of the low voltage of the initialization voltage Vinit in the normal operation is −5 V, −15 V is applied as the low voltage of the initialization voltage Vinit in the repairability checking step as shown in FIG. 7. That is, the values of the two low voltages are different by a factor of three times. The reason why such a large low voltage is applied in the initialization period Initial is to sufficiently lower the voltage of the gate electrode of the driving transistor T1 so that the driving transistor T1 can be turned on in all cases. Hereinafter, the lower voltage of the initialization voltage Vinit used during the normal driving is referred to as a normal low voltage, and the lower low voltage used in the repairability checking step is referred to as a repair low voltage.

Hereinafter, an operation of a pixel when signals shown in FIG. 7 are applied will be described.

First, the initialization voltage Vinit is temporarily lowered to the low voltage and then is changed to the high voltage in the on-bias period On bias. In the exemplary embodiment of FIG. 7, a low voltage value of the initialization voltage Vinit used in the on-bias period On bias is the normal low voltage. However, according to another example embodiment, a repair low voltage having a lower voltage value may be used. In the on-bias period On bias, since the second driving voltage ELVSS has a high voltage, no current flows through the organic light emitting diode OLED. The on-bias period On bias serves to connect the emission period Emission and the initialization period Initial before the initialization period Initial. Accordingly, the on-bias period On bias may be omitted according to another exemplary embodiment.

Next, when the initialization period Initial is entered, the initialization voltage Vinit is lowered to the repair low voltage while changing the driving voltage ELVDD to a low voltage. The repair low voltage value has a voltage value that is three times that of the normal low voltage value, so that the voltage of the node M is lowered to a value that is sufficient to turn on the driving transistor T1. However, since the value of the driving voltage ELVDD is also lowered, there is no current outputted from the driving transistor T1. In addition, since the second driving voltage ELVSS of the organic light emitting diode OLED has a high voltage, no current is applied to the light emitting diode OLED.

Thereafter, in the threshold voltage compensation period Vth comp., the second transistor T2 and the third transistor T3 maintain the turn-off state, so that the compensated voltage of the threshold voltage cannot be delivered to the node M. Similarly, since the second driving voltage ELVSS of the organic light emitting diode OLED has a high voltage, no current is applied to the light emitting diode OLED.

Next, the programming period Programming proceeds but the second transistor T2 maintains the turn-off state, so that the voltage change of the node N due to the change of the data voltage is not transferred to the node M. Similarly, since the second driving voltage ELVSS of the organic light emitting diode OLED has a high voltage, no current is applied to the light emitting diode OLED.

Next, as the light emission period Emission progresses, the driving voltage ELVDD and the second driving voltage ELVSS are changed to a high voltage and a low voltage, and a current starts to flow to the organic light emitting element OLED. In this case, the magnitude of the flowing current is changed depending on the voltage of the node M. In the initialization period Initial, since the repair low voltage is applied as the initialization voltage Vinit to make the voltage low enough, a case where the driving transistor T1 does not output a current may not occur. According to another example, the initialization voltage may be changed to the repair low voltage to be applied in the light emission period Emission. In this case, the driving transistor T1 can be turned on more reliably.

When signals as shown in FIG. 7 are applied but the organic light emitting diode OLED does not emit light during the light emission period Emission, this problem is caused by a defect in manufacturing and it is determined that the problem is not repairable. When it is determined that the problem is not repairable, the display panel may be treated as defective.

FIG. 7 illustrate an exemplary embodiment including the on-bias period On bias, the initialization period Initial, the threshold voltage compensation period Vth comp., the programming period Programming, and the light emission period Emission. However, it is also possible to perform the repairability checking step using only the initialization period Initial and the light emission period Emission. This is because the voltage compensation period Vth comp. and the programming period Programming do not operate substantially as the second transistor T2 and the third transistor T3 are turned off as described above. In addition, according to another exemplary embodiment, the initialization period Initial may be omitted, and may be constituted by only one period. This will be described below with reference to FIG. 12 below.

Figure 8:
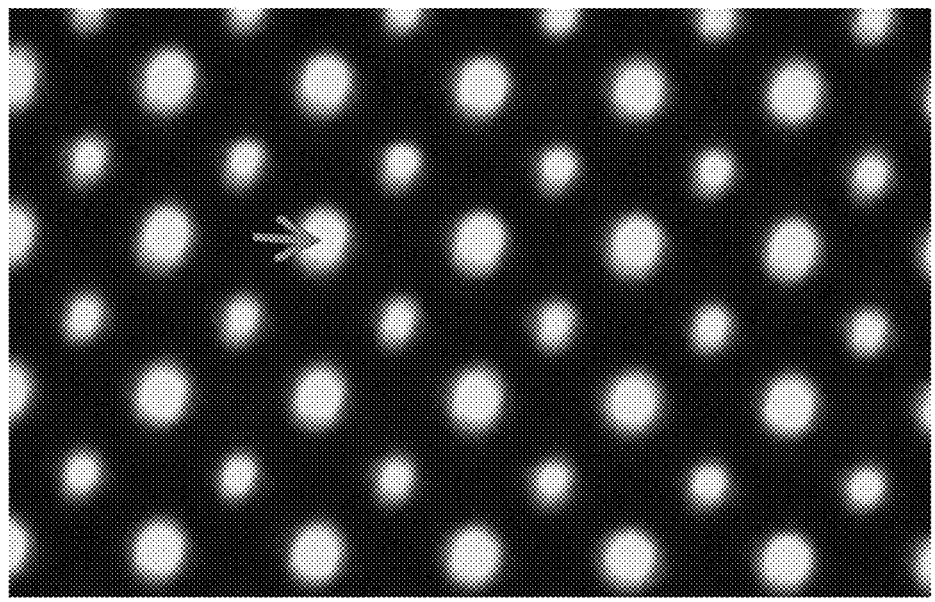
FIG. 8 is a photograph showing an operation of the pixel according to FIG. 7.

As in FIG. 6 and FIG. 7, when the repairability checking step is performed, a corresponding pixel forcibly emits light as illustrated in FIG. 8, except being caused by a defect in manufacturing.

FIG. 8 is a photograph showing an operation of the pixel according to FIG. 7.

When a signal according to FIG. 7 is applied, the repairable pixel emits light as in the pixel indicated by the arrow in FIG. 8 in the light emission period Emission.

Figure 9:
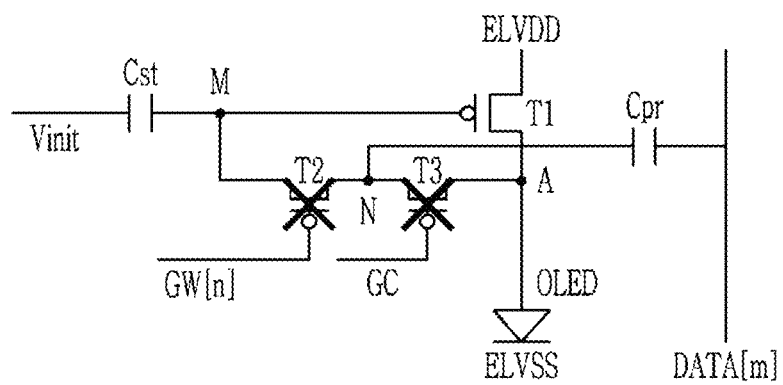
FIG. 9 illustrates an equivalent circuit diagram of one pixel in one step of a repairing method of an organic light emitting diode display according to an exemplary embodiment.
Figure 10:
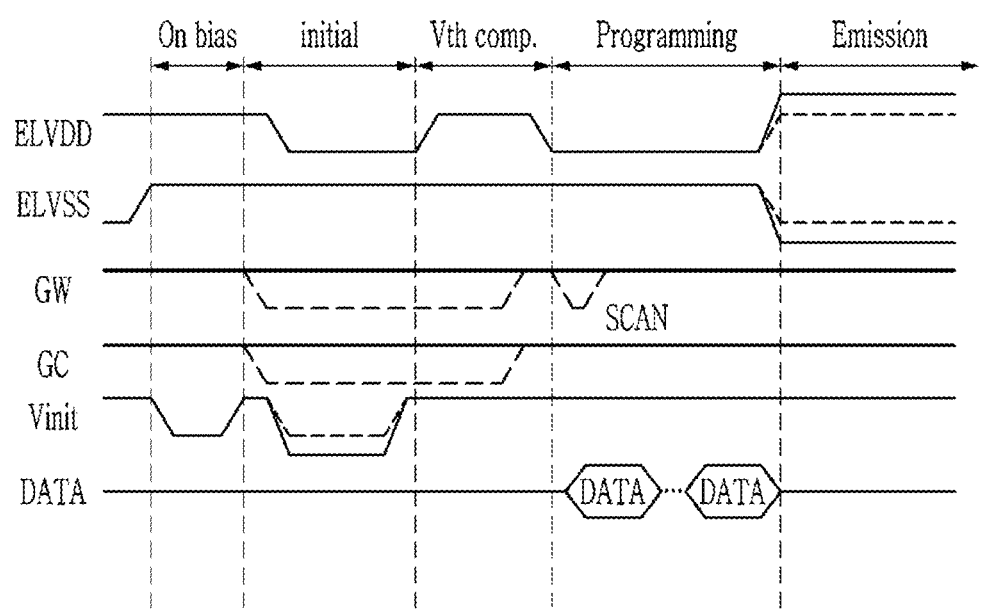
FIG. 10 illustrates a timing diagram of signals applied in one step of a repairing method of an organic light emitting diode display according to an exemplary embodiment.

As such, when it is checked that the pixel is not caused by the defect in manufacturing and is repairable, the stress applying step is performed as in FIG. 9 and FIG. 10. The stress applying step serves to repair an abnormally driven pixel by applying stress thereto for a predetermined time.

A signal applied to a pixel in the stress applying step and a corresponding operation of the pixel will be described with reference to FIG. 9 and FIG. 10.

FIG. 9 illustrates an equivalent circuit diagram of one pixel in one step of a repairing method of an organic light emitting diode display according to an exemplary embodiment. FIG. 10 illustrates a timing diagram of signals applied in one step of a repairing method of an organic light emitting diode display according to an exemplary embodiment.

First, referring to FIG. 10, the driving voltage ELVDD and the second driving voltage ELVSS applied during the light emission period Emission are changed to be applied, unlike in the repairability checking step of FIG. 7. That is, a high voltage value (hereinafter referred to as a voltage value of the stress high voltage) which is about two times that of the normal high voltage (the high voltage applied in the exemplary embodiment of FIG. 2) is applied as the high voltage of the driving voltage ELVDD applied in the light emission period Emission. According to another exemplary embodiment, the stress high voltage may be 1.5 to 2 times that of the normal high voltage.

In an exemplary embodiment, the normal high voltage value is +6.5 V, and in this case, the voltage value of the stress high voltage of the driving voltage ELVDD is +12 V. In addition, a low voltage value (hereinafter referred to as a voltage value of the stress low voltage) which is about 7.5 to 10 times that of the normal low voltage (the low voltage applied in the exemplary embodiment of FIG. 2) is applied as the low voltage of the second driving voltage ELVSS applied in the light emission period Emission. According to another exemplary embodiment, the stress low voltage may be 4 to 10 times that of the normal low voltage. In an exemplary embodiment, the normal low voltage value is −2 V, and in this case, the voltage value of the stress low voltage of the second driving voltage ELVSS is −15 V.

In FIG. 10, only the high voltages are applied as the scan signal applied to the gate line GW[n] and the control signal applied to the control signal line GC, unlike the normal driving. Accordingly, a structure illustrated in FIG. 9 has a same structure as a case without the second transistor T2 and the third transistor T3. As a result, the structure of FIG. 9 is the same as that of FIG. 6. That is, in this case, the pixel is the same as a pixel including the driving transistor T1, the organic light emitting element OLED, and the holding capacitor Cst. As a result, the organic light emitting diode OLED according to FIG. 10 emits light regardless of the data voltage.

FIG. 10 is the same as FIG. 7 except for the light emission period, and thus the descriptions of other periods will be omitted.

FIG. 10 illustrates an exemplary embodiment including the on-bias period On bias, the initialization period Initial, the threshold voltage compensation period Vth comp., the programming period Programming, and the light emission period Emission. However, it is also possible to perform the repairability checking step using only the initialization period Initial and the light emission period Emission. This is because the voltage compensation period Vth comp. and the programming period Programming do not substantially operate as the second transistor T2 and the third transistor T3 are turned off as described above. The on-bias period On bias serves to connect the emission period Emission and the initialization period Initial before the initialization period Initial. Accordingly, the on-bias period On bias may be omitted according to another exemplary embodiment. In addition, according to another exemplary embodiment, the initialization period Initial may be omitted, and may be constituted by only one period. This will be described below with reference to FIG. 12 below.

In the light emission period Emission of FIG. 10, a voltage difference between the driving voltage ELVDD and the second driving voltage ELVSS is further increased in order to apply stress to the pixel. As a result, the difference between the voltage of the gate electrode of the driving transistor T1 and the driving voltage ELVDD becomes larger and an outputted current becomes larger. Further, the voltage difference between the node A and the second driving voltage ELVSS also increases, so that the luminance represented by the organic light emitting diode OLED also has a larger value. According to another example, the initialization voltage Vinit provided in the light emission period Emission may not have a high voltage value, and may have a repair low voltage value.

Although a method in which the on-bias period On bias is operated again after the light emission period is used in FIG. 2, the signal application is terminated after the emission is sustained for a predetermined time, to turn off the organic light emitting diode OLED in FIG. 10.

That is, the light emission is stopped to terminate the stress applying step after the light emission for a predetermined time.

The time to apply stress is discussed in Table 1 below.

TABLE 1

| Time | Voltage difference 8.5 V between driving voltages | Voltage difference 27 V between driving voltages |
| --- | --- | --- |
| 180 s | 30% | 30% |
| 300 s | 30% | 46% |

Table 1 shows results of applying stress to a pixel for 180 seconds and for 300 seconds. In addition, tests were performed when normal driving voltages were applied as the driving voltage ELVDD and the second driving voltage ELVSS applied to the pixel (voltage difference of 8.5 V between the driving voltages) and when the voltage difference was increased to be applied (voltage difference of 27 V between the driving voltages).

For normal driving (voltage difference of 8.5 V between driving voltages), +6.5 V was used for the driving voltage ELVDD and −2 V was used for the second driving voltage ELVSS. In the meantime, in the case of FIG. 10, +12 V was used for the driving voltage ELVDD and −15 V was used for the second driving voltage ELVSS.

As can be seen in Table 1, in the case where the pixel is normally turned on, 30% is effective in most cases. However, when providing a large voltage difference for 300 seconds as in FIG. 10, it is seen that 46% of pixels are repaired.

Accordingly, it is seen that an application time of stress needs to be equal to or higher than a certain level so as to accomplish an excellent repair effect, and it may be appropriate to apply the stress for 300 seconds or longer in the experimental result.

Applying the stress for a too long time may cause pixel degradation, and thus the stress may be applied for less than 10 minutes.

The repair effect will be described with reference to FIG. 11.

Figure 11:
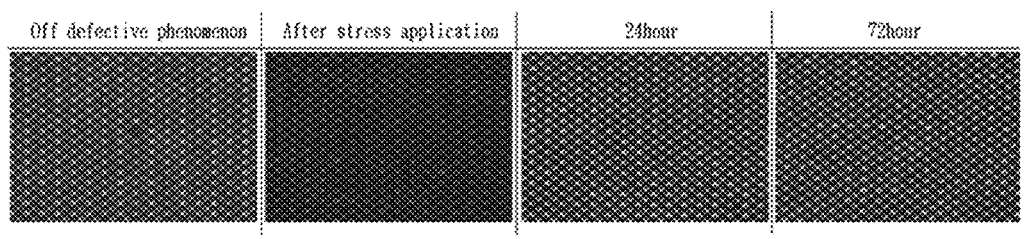
FIG. 11 illustrates a result of repairing a pixel to be normally operated by a repairing method of an organic light emitting diode display according to an exemplary embodiment.

FIG. 11 illustrates a result of repairing a pixel to be normally operated by a repairing method of an organic light emitting diode display according to an exemplary embodiment.

Drawings of operations of a total of four pixels are included in FIG. 11. A leftmost drawing in FIG. 4 shows that the pixel shows lower luminance than the normal luminance.

A second drawing from the left is a drawing after the stress applying step is performed for a certain time.

This shows that general luminance is lower than in a rightmost drawing, but it is caused by a surrounding situation of the drawing, and generally has a same luminance as the rightmost drawing and shows a pixel that does not normally emit light performing normal light emission.

The two drawings on the right side are for checking whether the normal light-emitting pixel continues to emit normally even after a long period of use. That is, since it is seen that the pixel emits normal light even after 24 hours and 72 hours have elapsed, it is seen that the pixel repaired by the present exemplary embodiment is permanently repaired.

In the above description, as in FIG. 7 and FIG. 10, an exemplary embodiment in which the repairability checking step and the stress applying step are performed while using at least one of various periods similarly to the case of FIG. 2 has been described.

However, according to another exemplary embodiment, it is possible to perform the repairability checking step and the stress applying step by using only one period. That is, it is possible to perform the repairability checking step using only one period corresponding to the light emission period Emission, and then perform the stress applying step in one period.

This will be described with FIG. 12 and FIG. 13.

FIG. 12 and FIG. 13 illustrate voltages applied in a repairing method of an organic light emitting diode display according to an exemplary embodiment.

FIG. 12 illustrates a voltage applied to the pixel of FIG. 1 in the repairability checking step, and FIG. 13 illustrates a voltage applied to the pixel of FIG. 1 in the stress applying step.

First, the repairability checking step will be described with reference to FIG. 12.

FIG. 12 shows a difference between the voltage applied in the repairability checking step and the voltage applied during normal driving.

In the exemplary embodiment of FIG. 12, voltage variation depending on various periods is not provided, but one period is used, unlike in the exemplary embodiment of FIG. 7.

The repair low voltage (−15 V) is applied instead of the normal low voltage (−5 V) of the initialization voltage Vinit in the repairability checking step according to the exemplary embodiment of FIG. 12. Herein the repair low voltage is three times the normal low voltage. The second transistor T2 and the third transistor T3 are turned off by applying a high voltage to the gate electrode of the second transistor T2 and the third transistor T3, to maintain the turn-off state of the second transistor T2 and the third transistor T3.

A voltage equal to the voltage during normal operation is applied as the driving voltage ELVDD and the second driving voltage ELVSS. That is, the high voltage of the driving voltage ELVDD during the normal driving has the same voltage (+6.5 V) as the driving voltage ELVDD in the repairability checking step. The voltage of the second driving voltage ELVSS during the normal driving has the same voltage (−2 V) as the second driving voltage ELVSS in the repairability checking step.

When such a signal is applied to the pixel of FIG. 1, it operates as shown in FIG. 6. In FIG. 6, the initialization voltage Vinit is the repair low voltage (−15 V), the driving voltage ELVDD is the normal driving voltage (+6.5 V), and the second driving voltage ELVSS is the normal second driving voltage (−2 V).

When such a signal is applied, the voltage of the node M becomes sufficiently low to turn on the driving transistor T1 and forcibly emit light. That is, if a pixel is free from a defect in manufacturing, it emits light, and thus it is possible to check whether the repair is possible according to the present exemplary embodiment.

Hereinafter, the stress applying step will be described with reference to FIG. 13.

FIG. 13 shows a difference between the voltage applied during the stress applying step and the voltage applied during normal driving.

In the exemplary embodiment of FIG. 13, a voltage variation depending on various periods is not provided, but one period is used unlike in the exemplary embodiment of FIG. 10.

The repair low voltage (−15 V) is applied instead of the normal low voltage (−5 V) of the initialization voltage Vinit in the stress applying step according to the exemplary embodiment of FIG. 13. In addition, a stress voltage (+12 V) which is higher than the normal high voltage is applied as the driving voltage ELVDD, and a stress voltage (−15 V) which is lower than the normal high voltage is applied as the voltage of the second driving voltage ELVSS. Herein, the stress high voltage is about twice as high as the normal high voltage, and the stress low voltage is 7.5 times to 10 times as high as the normal low voltage. According to another exemplary embodiment, the stress high voltage is about 1.5 to 2 times as high as the normal high voltage, and the stress low voltage is 4 times to 10 times as high as the normal low voltage.

The second transistor T2 and the third transistor T3 are turned off by applying a high voltage to the gate electrode of the second transistor T2 and the third transistor T3, to maintain the turn-off state of the second transistor T2 and the third transistor T3.

When such a signal is applied to the pixel of FIG. 1, it operates as shown in FIG. 9. In FIG. 9, the initialization voltage Vinit is the repair low voltage (−15 V), the driving voltage ELVDD is the stress high voltage (+12 V), and the second driving voltage ELVSS is the stress low voltage (−15 V).

When such a signal is applied, the voltage of the node M becomes sufficiently low, and the voltage difference of the Vgs of the driving transistor T1 is further increased to increase the output current. In addition, the voltage of the second driving voltage ELVSS applied to the organic light emitting diode OLED is also lowered, so that the voltage difference with the node A becomes larger and the organic light emitting diode OLED emits light with high luminance while being stressed.

The stress is applied for not less than about 300 seconds and not more than 10 minutes in this stress applying step, although times appreciably longer than this may be wasteful and/or result in damage. Next, the voltage applied to the pixel is removed to prevent the organic light emitting diode OLED from emitting light.

When such a stress applying step is performed, as shown in FIG. 11, the case where the light is emitted abnormally again does not occur, and the repair is completed.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A repairing method for an organic light emitting diode display, comprising:
a repairability checking step comprising applying a first positive bias to a pixel including a driving transistor and an organic light emitting diode based on the organic light emitting diode; and
a stress applying step comprising applying a second positive bias that is greater than the first positive bias to the organic light emitting diode for a predetermined time period.

2. The repairing method of claim 1, wherein
the first positive bias and the second positive bias are determined by a driving voltage and a second driving voltage applied to the pixel.

3. The repairing method of claim 2, wherein
the driving voltage and the second driving voltage applied for the first positive bias are equal to a driving voltage value and a second driving voltage value applied to the pixel during a normal driving period for displaying an image.

4. The repairing method of claim 3, wherein
the driving voltage applied for the second positive bias is greater than the driving voltage applied for the first positive bias, and
the second driving voltage applied for the second positive bias is less than the second driving voltage applied for the first positive bias.

5. The repairing method of claim 4, wherein
the driving voltage applied for the second positive bias has a value of 1.5 to 2 times that of the driving voltage applied for the first positive bias, and
the second driving voltage applied for the second positive bias is 7.5 to 10 times that of the second driving voltage applied for the first positive bias.

6. The repairing method of claim 1, wherein
the repairability checking step determines that repair is possible when the organic light emitting diode normally emits light.

7. The repairing method of claim 1, wherein
the stress applying step is performed for from about 300 seconds to 10 minutes.

8. The repairing method of claim 1, wherein
the pixel further includes a storage capacitor connected to a gate electrode of the driving transistor,
an initialization voltage is applied to a second end of the storage capacitor, and
a same initialization voltage is applied in the repairability checking step and the stress applying step.

9. The repairing method of claim 8, wherein
the initialization voltage enables the driving transistor to turn on.

10. The repairing method of claim 8, wherein
when a point where the driving transistor and the organic light emitting diode are connected is defined to as a node A,
the pixel further includes a second transistor and a third transistor connected between the gate electrode of the driving transistor and the node A, and
the second transistor and the third transistor are maintained in an off-state in the repairability checking step and the stress applying step.

11. An organic light emitting diode display, comprising:
an organic light emitting diode of a pixel;
a driving transistor configured to supply a current to the organic light emitting diode;
a storage capacitor connected to a gate electrode of the driving transistor;
when a node where the organic light emitting diode and the driving transistor are connected is defined to as a node A,
a second transistor and a third transistor connected between the node A and the gate electrode of the driving transistor; and
when a node between the second transistor and the third transistor is defined to as a node N, an input capacitor connected between the node N and a data line,
wherein an initialization voltage is applied to a second end of the storage capacitor,
a driving voltage is applied to the driving transistor, and
a second driving voltage is applied to a second end of the organic light emitting diode.

12. The organic light emitting diode display of claim 11, wherein
the second transistor is operated by a scan signal, and the third transistor is operated by a control signal.

13. The organic light emitting diode display of claim 12, wherein
the pixel sequentially emits light through an initialization period, a threshold voltage compensation period, a programming period, and a light emission period.

14. The organic light emitting diode display of claim 13, wherein
in the light emission period,
a high voltage is applied as the driving voltage,
a low voltage is applied as the second driving voltage,
a high voltage is applied as the initialization voltage, and
high voltages are applied as the scan signal and the control signal.

15. The organic light emitting diode display of claim 13, wherein
a high voltage is applied as the second driving voltage except in the light emission period.

16. The organic light emitting diode display of claim 15, wherein
in the initialization period,
a low voltage is applied as the driving voltage,
low voltages are applied as the scan signal and the control signal, and
a low voltage is applied as the initialization voltage.

17. The organic light emitting diode display of claim 15, wherein
in the threshold voltage compensation period,
a high voltage is applied as the driving voltage,
a high voltage is applied as the initialization voltage, and
the scan signal and the control signal are changed from a low voltage to a high voltage.

18. The organic light emitting diode display of claim 15, wherein
in the programming period,
a low voltage is applied as the driving voltage,
a high voltage is applied as the initialization voltage, a high voltage is applied as the control signal, and
a low voltage is sequentially applied as the scan signal.

19. The organic light emitting diode display of claim 13, wherein
the pixel further includes an on-bias period,
wherein, in the on-bias period, the initialization voltage is changed to a low voltage and then is changed to a high voltage.

20. The organic light emitting diode display of claim 11, wherein
a data voltage applied to the data line changes a voltage of the node N, and a voltage when the second transistor is turned on in the voltage of the node N is stored in the storage capacitor.

* * * * *